(12) United States Patent
St. Pierre et al.

(10) Patent No.: US 7,937,234 B2
(45) Date of Patent: May 3, 2011

(54) CLASSIFICATION OF SPATIAL PATTERNS ON WAFER MAPS

(75) Inventors: Eric R. St. Pierre, Chandler, AZ (US); Eugene Tuv, Chandler, AZ (US); Alexander Borisov, Nizhny Novgorod (RU)

(73) Assignee: Intel Corporation, Santa Clara, CA (US)

( * ) Notice: Subject to any disclaimer, the term of this patent is extended or adjusted under 35 U.S.C. 154(b) by 298 days.

(21) Appl. No.: 12/201,615

(22) Filed: Aug. 29, 2008

(65) Prior Publication Data

US 2010/0057391 A1 Mar. 4, 2010

(51) Int. Cl.
*G06F 19/00* (2011.01)
(52) U.S. Cl. ........... 702/81; 702/33; 702/35; 702/36; 702/82; 702/83; 702/84; 438/14; 438/15
(58) Field of Classification Search ............... 702/35, 702/33, 36, 81–84; 438/14, 15
See application file for complete search history.

(56) References Cited

U.S. PATENT DOCUMENTS

| | | | | |
|---|---|---|---|---|
| 6,049,895 A * | 4/2000 | Sugimoto | ............... | 714/46 |
| 7,194,387 B1 | 3/2007 | Filatov et al. | | |
| 2006/0184473 A1 * | 8/2006 | Eder | ............... | 706/20 |
| 2006/0239536 A1 * | 10/2006 | Shibuya et al. | ............... | 382/149 |
| 2007/0211932 A1 * | 9/2007 | Lee et al. | ............... | 382/145 |
| 2007/0288185 A1 * | 12/2007 | Burch et al. | ............... | 702/81 |

OTHER PUBLICATIONS

Friedman, D.J., Hansen, M.H., Nair V.N. and James, D.A. "Model-Free Estimation of Defect Clustering in Integrated Circuit Fabrication," IEEE Transactions on Semiconductor Manufacturing, vol. 10, No. 3, 1997, pp. 344-359.
Denby, L. and James, D. A. (1995). "A Graphical User Interface for Spatial Data Analysis in Integrated Circuit Manufacturing." In Meyer, M. and Rosenberg, J., editors, Computing Science and Statistics, vol. 27. Interface Foundation of North America, 8 pages.
Hansen, M. H., and James, D.A. (1997), "A Computing Environment for Spatial Data Analysis in the Microelectronics Industry", Bell Labs Technical Journal, vol. 2, No. 1, pp. 114-129.
Di Palma et al., "Process Diagnosis via Electrical-Wafer-Sorting Maps Classification," Proc. 5th IEEE Int'l Conf. Data Mining (ICDM 05), IEEE Press, 2005, pp. 123.1-123.4.
Di Palma et al., "Unsupervised spatial pattern classification of electrical-wafer-sorting maps in semiconductor manufacturing," Pattern Recognition Letters, vol. 26 No. 12, p. 1857-1865, Sep. 2005.
St. Pierre, E.R., Tuv, E., Borisov, A. "Spatial Patterns in Sort Wafer Maps and Identifying Fab Tool Commonalities," IEEE Advanced Semiconductor Manufacturing Conference, Manuscript May 6, 2008, Abstract Sep. 14, 2007; 5 pages.

* cited by examiner

*Primary Examiner* — Sujoy K Kundu
(74) *Attorney, Agent, or Firm* — Cool Patent, P.C.; Joseph P. Curtin

(57) ABSTRACT

Classification of spatial patterns on wafer maps is generally described. In one example, a method includes applying K-means type clustering to wafer maps comprising one or more spatial patterns to group one or more clusters comprising wafer maps having similar spatial patterns and producing a dendrogram using a clustering process to display the one or more clusters.

18 Claims, 4 Drawing Sheets

CLASSIFICATION OF SPATIAL PATTERNS ON WAFER MAPS

BACKGROUND

Generally, increasing semiconductor yields includes identifying spatial patterns associated with defects and eliminating the source of the defects based on wafer maps that provide, for example, electrical test (e-test) or sort bin data. Current methods may either require a manual supervised process that demands a significant amount of time, or apply processes that are not suited for large sample sizes, or do not provide visual interactive results for users to explore the spatial patterns, or combinations thereof.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

For simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of classification of spatial patterns on wafer maps are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily referring to the same embodiment. Furthermore, the particular features, structures or characteristics may be combined in any suitable manner in one or more embodiments.

Figure 1:
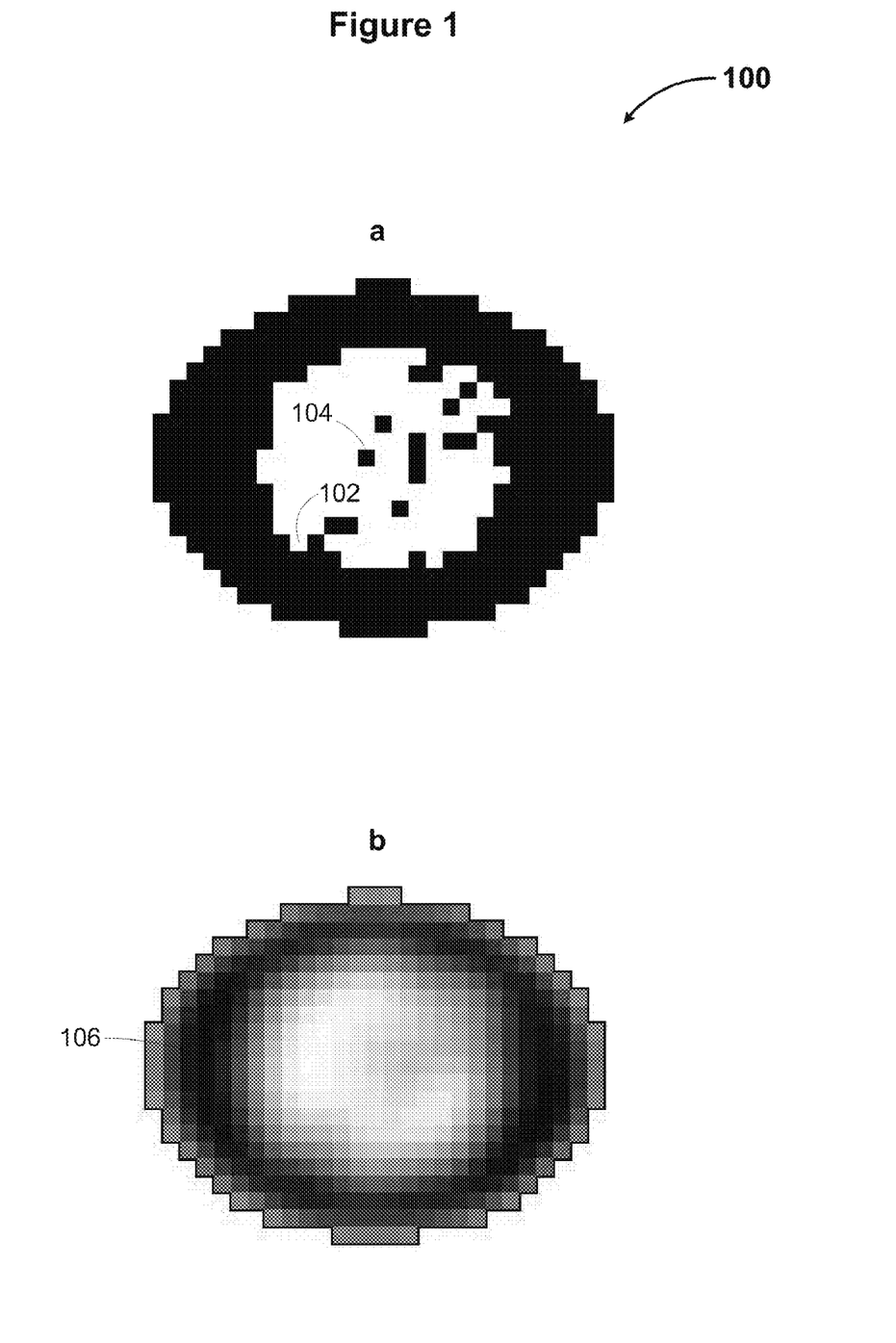
FIG. 1 is a schematic of an example wafer map comprising a spatial pattern before and after smoothing, according to but one embodiment.

FIG. 1 is a schematic of an example wafer map comprising a spatial pattern before and after smoothing, according to but one embodiment. FIG. 1a represents a wafer map prior to applying a smoothing process and FIG. 1b represents a wafer map after applying a smoothing process. Generally, semiconductor devices are fabricated on circular semiconductor wafers comprising dies. Dies may comprise rectangular areas of the semiconductor wafer that generally repeat to provide a discrete semiconductor device, product, and/or component per die area. Dies may be tested in a variety of ways including, for example, electrical test (E-test) or sort bin analysis to characterize the properties of the structures formed in the die area or scribe line areas between the dies. A wafer map may assign a binary variable based on data results at each die location. For example, a 1 may be assigned to die locations having data results above a threshold value and a 0 may be assigned to die locations having data results below a threshold value, or vice versa. A wafer map may depict the binary values at each die location using, for example, different colors, patterns, or other distinguishing mark or feature. In several applications, a binary variable represents defective or non-defective die according to the particular test, which may also be referred to as "good" or "bad" die.

In an embodiment according to FIG. 1a, a wafer map comprises one or more die locations 102 in white that are assigned a first binary value and one or more die locations 104 in black that are assigned a second binary value. Die locations 102 and 104 may form a spatial pattern on a wafer map that may be classified and/or analyzed for yield improvement. In an embodiment according to FIG. 1a, die locations on the periphery of the wafer are generally "bad" while die locations near the center area of the wafer are generally "good."

In an embodiment according to FIG. 1b, a wafer map after smoothing is depicted. In an embodiment, FIG. 1b is a depiction of FIG. 1a after a smoothing process, such as kernel-based smoothing, is applied. Smoothing may reduce the effect of noise in the spatial patterns by, for example, using the data of surrounding die to fill in gaps in the pattern or smoothing over single bad die surrounded by many good die. In an embodiment according to FIG. 1b, a ring-type spatial pattern 106 is depicted.

Figure 2:
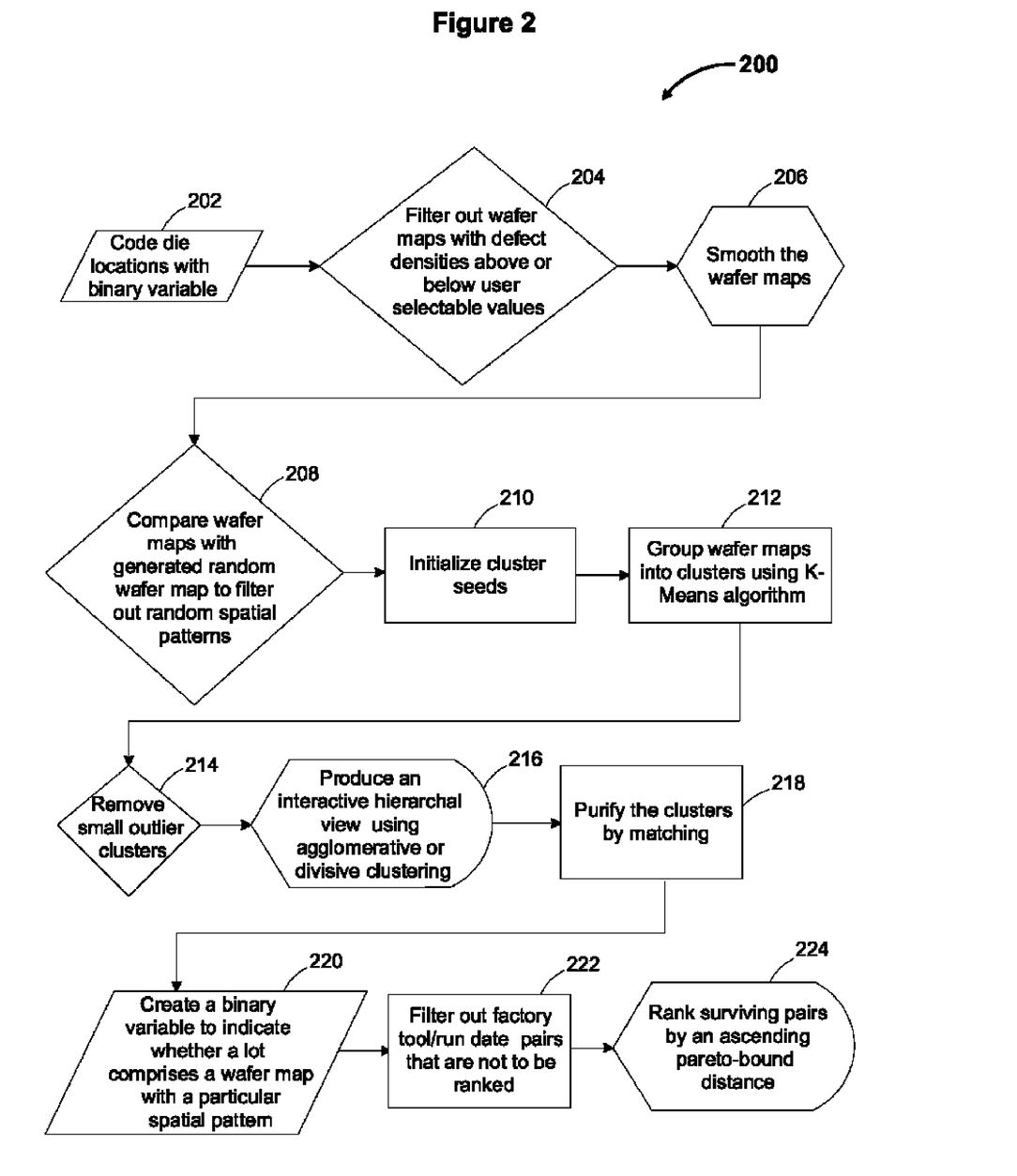
FIG. 2 is a process flow diagram of a method for classification of spatial patterns on wafer maps, according to but one embodiment.

FIG. 2 is a process flow diagram of a method for classification of spatial patterns on wafer maps, according to but one embodiment. In an embodiment, method 200 includes coding die locations with a binary variable 202, filtering out wafer maps with defect densities above or below user-selectable values 204, smoothing the wafer maps 206, comparing wafer maps with a generated random wafer map to filter out random spatial patterns 208, initializing cluster seeds 210, grouping wafer maps into clusters using a K-means type process 212, removing small outlier clusters 214, and/or producing an interactive hierarchal view such as a dendrogram using a clustering process 216. Method 200 may further include purifying the clusters by matching 218, creating a binary variable to indicate whether a lot contained a wafer map with a particular spatial pattern 220, filtering out factory tool/run date pairs that are not to be ranked 222, and/or ranking surviving pairs by an ascending pareto-bound distance 224.

Method 200 may include assigning a binary value to one or more die locations 202 of a wafer map to indicate whether the die location is above or below a threshold value. Dies may be tested in a variety of ways including, for example, electrical test (E-test) or sort bin analysis to characterize the properties of the structures formed in the die area or scribe line areas between the dies. A wafer map may be assigned a binary variable based on data results at each die location 202. For example, a 1 may be assigned to die locations having data results above a threshold value and a 0 may be assigned to die locations having data results below a threshold value, or vice versa. A wafer map may depict the binary values at each die location using, for example, different colors, patterns, or other distinguishing mark or feature. In several applications, a binary variable represents good or bad die according to the particular test. FIG. 1a may depict a binary wafer map prior to smoothing according to one embodiment. Large numbers of wafer maps may be characterized in this manner. In an embodiment, over 10,000 wafer maps may be coded with binary variables at die locations 202.

Method 200 may further comprise filtering out wafer maps comprising spatial-pattern densities that are above or below user-selectable values 204. Spatial-pattern densities on a wafer map may represent defect densities on a wafer in one embodiment. Filtering according to spatial-pattern density 204 may be used to eliminate spatial patterns that do not provide a meaningful basis for comparison. For example, a wafer which most or all of the die locations are "bad" may not provide a meaningful spatial pattern for comparison with other spatial patterns. Threshold densities may be selected and/or modified by a user. Filtering according to spatial-pattern density 204 may also be used to reduce the number of wafer maps that are subjected to subsequent operations such as, for example, smoothing 206, filtering for non-random spatial patterns 208, and/or grouping wafer maps using clustering processes 212, 216. Filtering 204 may be performed several times throughout method 200.

In an embodiment, method 200 further comprises smoothing the wafer maps 206. Kernel-based smoothing may be used to smooth the wafer maps 206. Other smoothing processes may be used in other embodiments. Smoothing 206 may reduce the effect of noise in the spatial patterns by, for example, using the data of surrounding die to fill in gaps in the pattern or smoothing over single bad die surrounded by many good die. In an embodiment, smoothing 206 transforms a wafer map to a density map with kernel density estimation using an exponential kernel. A kernel width may be a user-selectable multiple of an average distance between bad die on the wafer map. A radius that controls the number of surrounding die used for density estimation at a specific die location may have a user-selectable upper limit to speed calculation. FIG. 1b may depict a wafer map after kernel-based smoothing 206 has been performed. In an embodiment, smoothing 206 is performed prior to applying a K-means type clustering process to the wafer maps.

Method 200 may further comprise comparing the wafer maps with a wafer map comprising a generated random spatial pattern to filter out wafer maps that are similar to the wafer map comprising the generated random spatial pattern 208. Comparing to remove random spatial patterns 208 may reduce the number of wafer maps grouped into clusters using clustering processes 212, 216 and may also provide a set of wafer maps having non-random spatial patterns for clustering 212, 216.

Wafer maps may be compared to generated random wafer maps 208 of the same cardinality. Wafer maps that do not significantly differ from random maps may be removed. In an embodiment, a cumulative distribution function (CDF) of a wafer-density distribution for a smoothed 206 wafer map is compared against a CDF for random wafer maps having the same average defect density. A number of random wafer maps used for estimation at each density point may be user-selectable. Because generating a set of random wafer maps for each tested wafer may be computationally cumbersome, random wafer maps may be generated for several average densities covering evenly the full density range, followed by interpolation of CDF parameters for other average density values. A CDF may be estimated using a fixed number of points. In an embodiment, 200 points across the wafer map are used to estimate a CDF. Average densities may be centered and/or scaled to make interpolation more accurate and to account for different mean and standard deviation values for different average densities.

Comparing wafer maps with generated random wafer maps 208 may comprise using a chi-square test. In an embodiment, a binned and smoothed wafer-density CDF is compared against the same average CDF of random wafer maps 208 using a chi-square test wherein the p-value is user selectable. A number of points in seven density intervals may be compared against an estimated quantity for a random wafer map using the chi-square test. In an embodiment, density points from a smoothed wafer map to be tested for spatial randomness may be sorted and binned to seven equal-sized bins followed by estimating an average density and density deviation for the smoothed wafer map to be tested for randomness.

In an embodiment, f is an average defect density on a non-smoothed wafer map to be tested or compared for randomness 208. Average density and density deviation for the smoothed wafer map may be computed using interpolation over a user-defined number of random wafer maps computed at frequency points $f_i = f_{min} + i \cdot (f_{max} - f_{min})/(nf-1)$, $i=0 \ldots nf-1$, in which $f_{min}=0.05$, $f_{max}=0.8$, which may be minimal and maximal density of wafers respectively, nf is a number of frequency points, and i is the frequency interval. Other values may be used in other embodiments. Interpolation may be accomplished, for example, by calculating the average value of the parameter over random wafer maps at each frequency point, then deriving the value using $2^{nd}$ degree polynomial interpolation over five closest density points.

A grid may be created to estimate the CDF of generated random wafer maps. In an embodiment, a grid of f and p is created in which values for f are the same as above and p, for example, is selected by a user to be 200 equidistant values of smoothed densities (p=1/200). The probability of being less than p for a value of f is calculated from the generated random wafer maps, which may be accomplished, for example, by interpolation over the grid using a 2nd order polynomial that uses the 20 closest points in the grid. The mean or average density and density standard deviation from above may be used to normalize the bin boundaries to allow better interpolation of CDF for different average defect density values. The probability of being less than the bin bound is determined for each bin bound.

A chi-square test statistic, T, may be calculated according to $$T = \sum_{I=1 \ldots NI} (n_i - n_{0i})^2 / n_{0i} I$$

which $n_i$ is the actual number of points in the ith frequency interval for the wafer map being tested, $n_{0i}$ is the number of points in the ith frequency interval for the generated random wafer maps, and NI is the number of intervals used. In an embodiment, the number of intervals used is 7. Other numbers of intervals may be used in other embodiments. Test statistic, T, may be compared with the critical value interpolated over critical values calculated on random wafer map sets for neighboring average density points as described above. A determination of whether a wafer is random or not may be made using the user-selected p-value. In an embodiment, comparing the wafer maps with a wafer map comprising a generated random spatial pattern 208 occurs prior to applying a K-means type clustering process 212.

Method 200 may further comprise initializing cluster seeds 210. Grouping wafer maps having similar spatial patterns into clusters may facilitate semiconductor-yield analysis. Cluster seeds may be initialized 210 for the K-means type clustering process 212 wherein the number of cluster seeds is proportional to a number of wafer maps in a data set. For example, clustering may group over 10,000 wafer maps into about 50 clusters to allow more meaningful characterization of the wafer maps for yield analysis. The cluster seeds may be initialized 210 to have a large sum total distance between cluster seeds or to maximize a value of the sum total distance between cluster seeds.

Initializing cluster seeds 210 may further comprise performing a first iterative pass using a clustering process over the observations (i.e., wafer maps) and selecting an observation as a seed if it is further than a user-specified distance from previously selected centroids. A minimum distance relative to an average distance between observations may be user-specified. All remaining observations may be selected as cluster seeds if the number of observations left equals the number of cluster seeds to select. Several iterative passes may be performed over the observations wherein cluster seeds may be replaced with an observation if the minimum distance between seeds is increased by the replacement.

An initial minimum distance, $r_{min}$, between observations may be calculated using $$r_{\min} = r_0 \cdot \sum_{i=1\ldots n/2} d(w^j, w^{n-i})/(n/2),$$

in which $r_0$ is a relative minimum distance between centroids, w is an observation or wafer, i is a wafer or observation index, n is the number of wafers left after filtering 204, $$d(w^i, w^j) = \sum_s |w_s^i - w_s^j|^2$$

is a Euclidean distance between a pair of observations i and j, and s is a seed. A Euclidean distance may be applied to smoothed and/or transformed wafer maps 206 and a number of cluster seeds may be fixed. A first iterative pass over the observations may be performed to select the initial cluster seeds. If an observation is farther than $r_{min}$ from all previously selected seeds or the remaining number of observations to scan is less than or equal to the remaining number of seeds to select, the observation is accepted as a new seed.

Cluster seeds may be iteratively updated using several iterations over observations. After each iteration, observations may be scanned to check for at least two conditions. First, if the distance from the current observation to the closest seed is greater than the minimum distance between closest seeds $s_1$, $s_2$, then the current observation replaces one of the seeds. The seed of the closest seeds $s_1$, $s_2$ that is replaced may be the seed that has a larger distance to the closest seeds if the current observation replaces the seed. Second, replace seed $s_0$ nearest to a current observation with the current observation if a minimum distance from the seed, $s_0$, to a next nearest seed is less than a minimum distance to the nearest seed from the current observation after the current observation replaces $s_0$.

After a set of final seeds $\{s_i\}$, i=1 . . . K is determined, in which K is a number of clusters, cluster membership may be initialized. In an embodiment, an Lth cluster may comprise wafers i, such that L=arg $\min_1$ d($w^i$, $s_L$) wherein observations that are closer to the Lth seed than to other seeds are assigned to the Lth cluster.

Method 200 may further comprise grouping wafer maps into clusters using a K-means type process 212. Grouping wafers maps into similar groups called clusters 212 may reduce a large number of wafers to a number of similar clusters. A cluster may comprise a group of wafer maps that have similar spatial patterns. In an embodiment, more than 10,000 wafer maps are grouped into about 50 clusters using a K-means type clustering process 212. Other numbers of wafer maps and clusters may be used in other embodiments. In an embodiment, method 200 includes applying a K-means type clustering process to the wafer maps comprising one or more spatial patterns to group one or more clusters comprising wafer maps having similar spatial patterns 212.

A K-means clustering process with a modified distance function may be used 212. In an embodiment, a distance between two clusters $$C_1, C_2 \text{ is } d(C_1, C_2) = \sum_{i\in C_1, j\in C_2} d(w^j, w^j)/N_1 N_2$$

which $N_1$, $N_2$ is a number of observations in $C_1$, $C_2$. A Euclidean distance may be calculated using $$d(C_1, C_2) = d(\overline{C}_1, \overline{C}_2) + \sum_{i\in C_1} d(\overline{C}_1, w^j)/N_2 + \sum_{i\in C_2} d(\overline{C}_2, w^j)/N_1$$

in which $\overline{C}_1$, $\overline{C}_2$ are centroids (i.e., means) of clusters $C_1$, $C_2$. After initial cluster assignment is made 210, then a user-specified number of iterations may be performed. After an iteration, a closest cluster C($w^i$) is determined for each wafer map observation, $w^i$. The iterative process ends if no wafer map observations are moved or a user-selectable maximum number of iterations is reached.

Method 200 may further comprise removing small outlier clusters 214. In an embodiment, removing small outlier clusters 214 comprises filtering out clusters that contain less than a user-specified minimum of wafer maps prior to producing the dendrogram 216. K-means clustering 212 may be repeated for remaining observations until a user-selectable maximum number of iterations is reached. Filtering out small outlier clusters 214 may increase the speed of producing an interactive hierarchal view 216. Removing small outlier clusters 214 may be performed multiple times throughout method 200.

Method 200 may further comprise producing an interactive hierarchal view using a clustering process 216. For example, agglomerative or divisive clustering may be used to produce an interactive hierarchal view such as a dendrogram 216. In an embodiment, method 200 includes producing a dendrogram using a clustering process to display the one or more clusters. Producing the dendrogram 216 may comprise using agglomerative clustering to allow a user to visually select final cluster assignment of the wafer maps.

A set of clusters may be transformed into a dendrogram by agglomerative clustering 216. Using a sense of distance introduced with respect to grouping wafer maps into clusters using a K-means process 212, the two closest clusters are determined and merged. Such process may repeat until only one cluster remains. In this manner, a cluster tree or dendrogram may be formed 216. For each two merged clusters, a line that connects them may have a y-coordinate equal to a distance between clusters, which may be calculated as a cluster error for a parent minus a sum of cluster error for children. A vertical line from a terminal cluster node to a parent may have a fixed length. An example representation of a dendrogram is described with respect to FIG. 3.

Method 200 may further comprise purifying the clusters by matching 218. In an embodiment, purifying the clusters by matching 218 includes refining the one or more clusters by comparing the wafer maps of the one or more clusters with a signature spatial pattern to remove wafer maps that are not similar to the signature spatial pattern. For example, after a user determines a significant wafer map signature (i.e., spatial pattern), purification 218 may be performed by scoring and/or sorting the wafer maps according to their similarity to the signature. Similarity may be calculated by smoothing the wafer maps and finding areas A1 and A2 on both the wafer maps and the signature at various points where defect density, $d > m(1+\epsilon)$, in which m is mean defect rate and $\epsilon$ is a signature threshold. In an embodiment, a default value for $\epsilon$ is about 0.05.

A score may be assigned at points for the intersection of A1 and A2. In an embodiment, the score is calculated by subtracting a signature noise level density, snld, from a wafer map density, wmd, in which snld is a mean defect rate in an area where $d < m(1+\epsilon)$ on the signature. For a difference area in which, for example, A1 or A2 are evaluated, but not A1 and A2, a negative score may be assigned wherein the negative score is calculated using K*abs(wmd−snld), in which K is an adjustable parameter representing an out-of-signature penalty. A score at a point inside the signature may be multiplied by a weight equal to the difference between signature density at the point and signature noise level representing an average density in area outside of a signature area. A score at a point outside the signature may be multiplied by a weight equal to an average weight of points inside a signature and then normalized on a weighted sum of signature density minus signature noise level density over A1 and A2 such that a similarity between a signature and itself is unity or 1. The relationship may be reduced to supp(A1&A2)−K*supp(A1/A2+A2/A1) if both the signature and smoothed wafer maps have areas A1, A2 of the same density.

Method 200 may further comprise creating a binary variable to indicate whether a lot comprises a wafer map with a particular spatial pattern 220. A lot may comprise a group of wafers that are generally processed together at various process operations of semiconductor fabrication. For example, a lot may be processed as a batch in batch-process operations such as diffusion or etch processes or a lot may be processed as run-to-run in process operations that are performed sequentially on a single wafer at a time such as lithography. A wafer map with a particular spatial pattern may indicate a particular factory tool or process. Assigning a binary variable to a lot associated with a spatial pattern of a cluster may aid in investigation and mitigation of defective factory tools and/or process operations to increase semiconductor yields.

In an embodiment, a binary variable is assigned to one or more lots to indicate whether the one or more lots comprise a wafer map from a user-determined cluster 220. For example, a binary variable of 1 may be assigned for a lot that contained a wafer that was placed in a particular cluster during clustering 212, 216 and a binary variable of 0 may be assigned for a lot if the lot does not contain a wafer from the particular cluster, or vice versa. Other variables may be used in other embodiments.

Method 200 may further comprise filtering out wafer maps based on factory tool and run date by applying an Apriori-type process 222. A factory tool may comprise semiconductor fabrication equipment used to process one or more wafers of a lot and a run date may comprise a particular date and time one or more wafers of a lot are processed on a factory tool. Filtering out wafer maps 222 may remove factory tool/run date pairs that are not to be subsequently ranked 224. In an embodiment, filtering out wafer maps 222 is accomplished by using conditional support to filter an Apriori rule tree. Conditional support may be calculated by dividing the number of lots captured by the rule that contained at least one wafer having a particular spatial pattern by the total number of lots that contained at least one wafer having the particular spatial pattern. Using conditional support rather than typical item set support may vastly reduce computational complexity of using Apriori because lots with a particular spatial pattern are typically a rare class.

A run date may be nested with factory tool by assigning pairs of factory tool and run date as nodes of an Apriori tree. Nested factory tool/run date pairs may be superior for identifying a tool commonality over methods that do not nest time within the factory tool. Numeric variables may be discretized automatically using entropy criteria or equidistant/equal-sized criteria if automatic discretization fails. Categoric variables may be clustered using a decision tree process with simplified minimum description length (MDL) stopping criteria provided hereafter. Automatic discretization may use classification and regression tree (CART) induction process with entropy-splitting criteria.

Stopping criteria for filtering out factory tool/run date pairs 222 may include maximum tree depth in an embodiment. Simplified MDL stopping criteria may be used in an embodiment. For example, If $w(s)=I(T)-n_L I(T_L)/n-n_R I(T_R)/n < \alpha \ln(7n)/n$, then a split, s, is not accepted, in which $\alpha$ is a complexity penalty parameter, n is the number of observations in parent node T, $T_R$, $T_L$ are child nodes, $n_R$, $n_L$ are counts of observations in child nodes, $I(T)=p_0 \ln p_0 + (1-p_0)\ln(1-p_0)$ is entropy in node T, where $p_0$ is a rare class proportion in node T. Pruning may be performed after a tree is formed to reduce a number of bins to a number specified by a user if the number of bins exceeds a user-specified maximum. Pruning may be accomplished by sequentially collapsing terminals with smallest weight until the number of terminal nodes of the tree (i.e., bins) reaches a desired value. In an embodiment, rules with a length of 1 or 2 are used to avoid over-fitting the data. A rule set may be filtered by confidence and conditional support where minimums for each may be user-selectable.

Method 200 may further comprise ranking the wafer maps by an ascending pareto-bound distance 224. Wafer maps that are not filtered out based on factory tool and run date may be ranked by an ascending pareto-bound distance 224 calculated on a conditional support-confidence plane. A point may be defined to be on the pareto bound if for point $p_i=(s_i, c_i)$ there is no point $p_j=(s_j, c_j)$ such that $(s_j > s_i)$ & $(c_j > c_i)$, in which s represents conditional support and c represents confidence. The distance to the pareto bound may be defined as the minimum distance to a line between neighboring points on the pareto bound. A set of rules on the pareto bound may be sorted by this distance. Rules that lie on the pareto bound may be sorted according to the following manner. First, a line may be drawn to connect a point with maximal conditional support and a point with maximum confidence to define the end points on the edges of the pareto bound. Then, a normal to the line may be calculated and rules may be sorted on the pareto bound with respect to the gradient of the normal. The edge point with maximum confidence may then be put in a sorted list ahead of the edge point with maximum support. In an embodiment, rule creation may allow a tool commonality search where there is no time effect.

Method 200 may provide a variety of benefits. First, a method 200 described herein may allow the processing of a large number of wafer maps using less computing power in a faster manner than traditional spatial pattern classification methods. Method 200 may allow grouping and classification of thousands of wafer maps into clusters having similar spatial patterns which the spatial patterns of the clusters are of a different nature from cluster to cluster such as, for example, striped, checkerboard, ring, grid, blobs, wafer-level disconnected components, edge effects, and other patterns or signatures, in a matter of minutes without using pre-defined templates to classify such spatial patterns. In an embodiment, method 200 does not require spatial pattern templates prior to applying the K-means type clustering process to the wafer maps 212. Hierarchal grouping techniques of method 200 provide an ability to display and/or allow user interaction with clusters visually.

In an embodiment, method 200 provides the ability to assign a non-randomness index to spatial patterns of wafer maps that may be used to sort wafers by the strength of the patterns, for example, allowing removal of wafer maps with spatial patterns that are not statistically different from a generated random wafer map. Process control may be implemented according to such non-randomness index. Method 200 further allows the creation of commonality rules to identify factory tools and/or process operations responsible for particular spatial-pattern signatures. Such rules include nested run date/factory tool data pairs to more easily identify root causes for semiconductor-yield problems. Such rules may be ranked by use of conditional support and pareto bound methodology described herein.

In an embodiment, method 200 increases the speed of spatial-pattern detection for Semiconductor-yield analysis. In another embodiment, method 200 increases the speed of detection of factory tools that produce defective spatial patterns. An article of manufacture is also described. In an embodiment, the article of manufacture includes a storage medium having instructions stored thereon that, if executed, result in the actions of method 200 and associated actions described with respect to FIGS. 1-3.

Various operations may be described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 3:
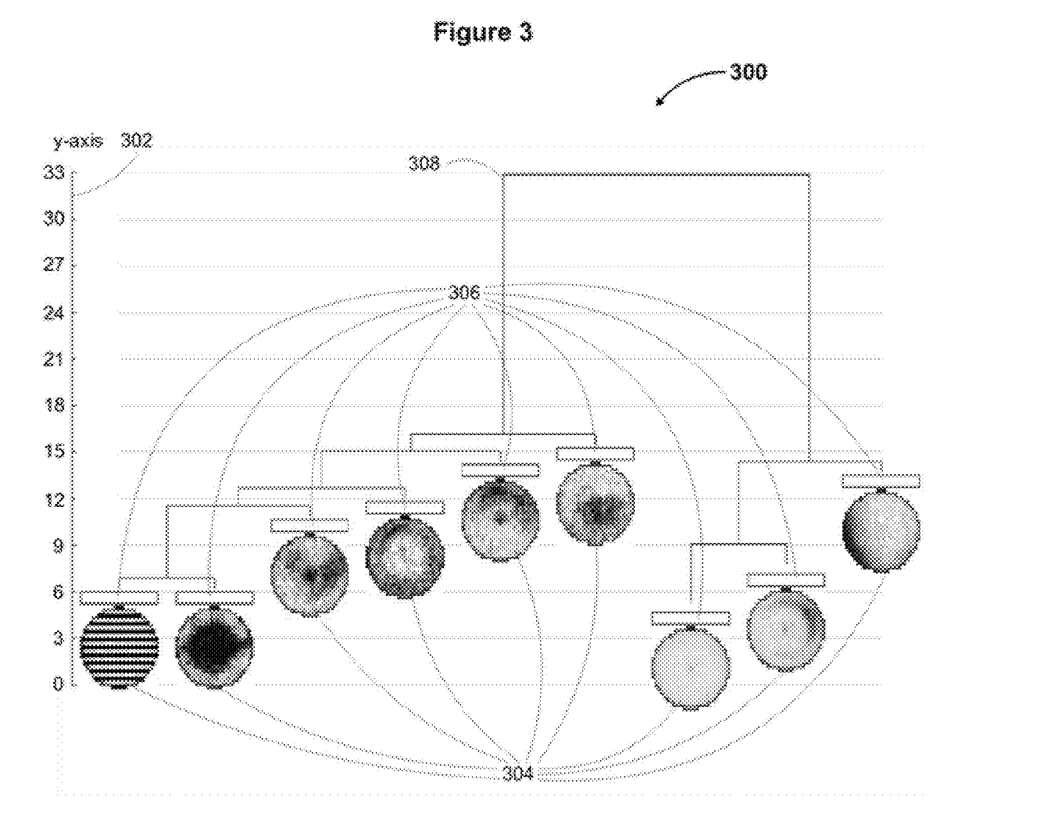
FIG. 3 is a dendrogram comprising one or more clusters, according to but one embodiment.

FIG. 3 is a dendrogram comprising one or more clusters, according to but one embodiment. In an embodiment, dendrogram 300 includes a y-axis 302 depicting a minimum distance wafer maps must be separated before they are split into a cluster, one or more wafer map clusters 304 comprising cumulative spatial patterns at one or more nodes 306 of tree structure 308.

Dendrogram 300 includes a y-axis 302 wherein the numbers on the y-axis represent a distance described with respect to grouping wafer maps into clusters 304 using a K-means process 212 of method 200. In an embodiment, a user may increase or decrease a minimum distance interactively with the dendrogram 300 to increase or decrease the number of clusters 304. Interactive dendrogram 300 may provide a user with an intuitive feel for how wafer maps 304 are positioned in this high-dimensional space. For example, a user may increase the number of clusters 304 by reducing the distance 302 between clusters 304 or decrease the number of clusters 304 by increasing the distance 302 between clusters 304. Through such interactivity, users may gain an intuitive feel for how the wafer maps are actually distributed including which wafers are close together (i.e., look similar) and which are far apart (i.e., look dissimilar). Such technique may combine the strength of the methodology to quickly summarize a large amount of information with that of the human eye to recognize patterns.

Clusters 304 may depict a cumulative wafer map for wafer maps in a particular cluster. The cumulative wafer maps or clusters 304 may depict a cumulative spatial pattern that is based on spatial patterns of all wafer maps within the cluster 304. In an embodiment, a user may view individual wafer maps for each wafer in a cluster 304. Nodes 306 may correspond with a number of clusters 304. In an embodiment, nodes 306 include information such as a number of wafer maps in the cluster (i.e., the number outside of the parentheses) and a number of lots affected (i.e., the number inside of the parentheses).

Figure 4:
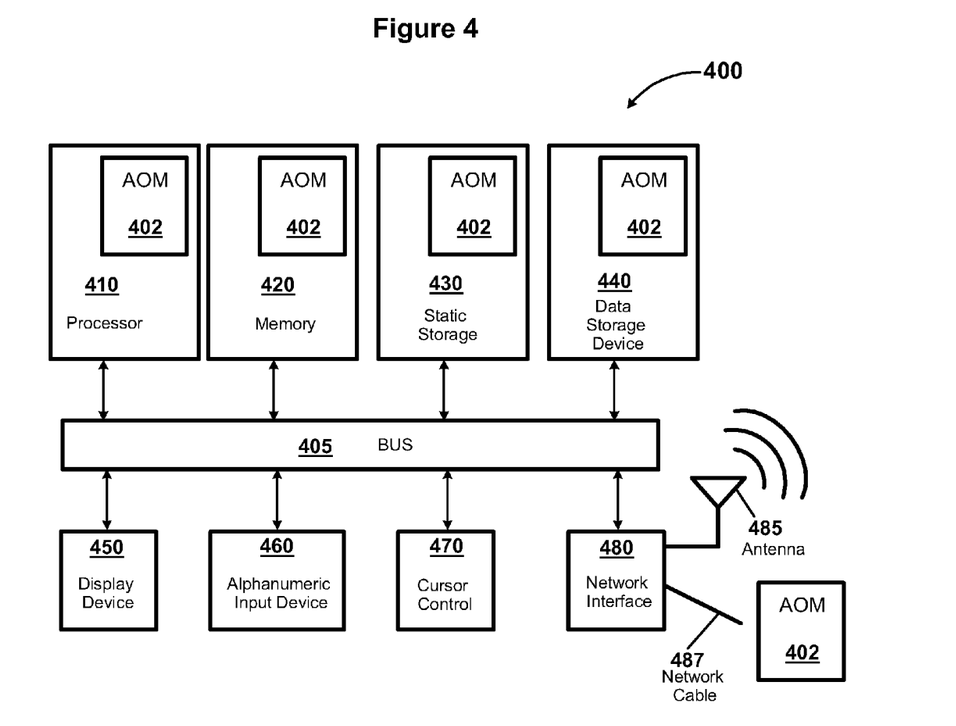
FIG. 4 is a diagram of an example system in which an article of manufacture as described herein may be used, according to but one embodiment.

FIG. 4 is a diagram of an example system in which an article of manufacture as described herein may be used, according to but one embodiment. In an embodiment, an article of manufacture includes a storage medium having instructions stored thereon that, if executed, result in the actions of method 200 and/or actions described with respect to FIGS. 1-3. System 400 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 400 includes an article of manufacture (AOM) 402 as described herein. In an embodiment an article of manufacture (AOM) 402 as described herein is part of an electronic system's processor 410, memory 420, static storage 430, data storage device 440, or is coupled with a network interface 480 via, for example, antenna 485 or network cable 487.

Electronic system 400 may include bus 405 or other communication device to communicate information, and processor 410 coupled to bus 405 that may process information. While electronic system 400 may be illustrated with a single processor, system 400 may include multiple processors and/or co-processors. In an embodiment, processor 410 includes an article of manufacture (AOM) 402 in accordance with embodiments described herein. System 400 may also include random access memory (RAM) or other storage device 420 (may be referred to as memory), coupled to bus 405 and may store information and instructions that may be executed by processor 410.

Memory 420 may also be used to store temporary variables or other intermediate information during execution of instructions by processor 410. Memory 420 is a flash memory device in one embodiment. In another embodiment, memory 420 includes an article of manufacture (AOM) 402 as described herein.

System 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled with electronic system 400. In an embodiment, static storage device or data storage device 440, or combinations thereof, comprises an article of manufacture (AOM) 402 as described herein.

Electronic system 400 may also be coupled via bus 405 to display device 450, such as a cathode ray tube (CRT) or liquid crystal display (LCD), to display information to a user. Alphanumeric input device 460, including alphanumeric and other keys, may be coupled to bus 405 to communicate information and command selections to processor 410. Another type of user input device is cursor control 470, such as a mouse, a trackball, or cursor direction keys to communicate information and command selections to processor 410 and to control cursor movement on display 450.

Electronic system 400 further may include one or more network interfaces 480 to provide access to network, such as a local area network. Network interface 480 may include, for example, a wireless network interface having antenna 485, which may represent one or more antennae. Network interface 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface 480 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol. In an embodiment, network interface 480 is coupled with an article of manufacture (AOM) 402 as described herein.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of the description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. A method, comprising:
    applying K-means type clustering to wafer maps comprising one or more spatial patterns to group one or more clusters comprising wafer maps having similar spatial patterns, each wafer map comprising data representing at least one property of a structure formed at each of a plurality of locations on a semiconductor wafer, the semiconductor wafer comprising a die at each location of the plurality of locations on the semiconductor wafer, and each die comprising at least one structure, the property of the structure being capable of being analyzed for a wafer yield determination;
    producing a dendrogram using a clustering process to display the one or more clusters;
    filtering out wafer maps based on factory tool and run date by applying a process based on an Apriori algorithm; and
    ranking the wafer maps that are not filtered out based on factory tool and run date by an ascending pareto-bound distance.

2. A method according to claim 1, wherein filtering out wafer maps based on factory tool and run date comprises using conditional support wherein nodes of the process based on the Apriori algorithm comprise pairs of factory tool and run date wherein the run date is nested within the factory tool, and wherein ranking the wafer maps by the ascending pareto-bound distance is calculated on a conditional support-confidence plane.

3. A method according to claim 2, further comprising:
    assigning a binary value to one or more die locations of the wafer maps to indicate whether the die location is above or below a threshold value for the at least one property of a structure of a die;
    filtering out wafer maps comprising spatial pattern densities that are above or below user-selectable values for the at least one property of a structure of a die; and
    smoothing the wafer maps using kernel-based smoothing prior to applying the K-means type clustering to the wafer maps.

4. A method according to claim 2, further comprising:
    initializing a number of cluster seeds for the K-means type clustering prior to applying the K-means type clustering process to the wafer maps wherein the number of cluster seeds is proportional to a number of wafer maps in a data set and wherein the cluster seeds are initialized to maximize a value of sum total distance between cluster seeds; and
    filtering out clusters that contain less than a user-specified minimum of wafer maps prior to producing the dendrogram.

5. A method according to claim 2, further comprising:
    refining the one or more clusters by comparing the wafer maps of the one or more clusters with a signature spatial pattern to remove wafer maps that are not similar to the signature spatial pattern; and
    assigning a binary value to one or more lots of semiconductor wafers to indicate whether the one or more lots comprise a wafer map from a user-determined cluster.

6. A method according to claim 2, wherein the method does not require spatial pattern templates prior to applying the K-means type clustering to the wafer maps.

7. A method according to claim 2, wherein producing the dendrogram comprises using agglomerative clustering to allow a user to visually select final cluster assignment of the wafer maps.

8. A method according to claim 2, further comprising:
comparing the wafer maps with a wafer map comprising a generated random spatial pattern to filter out wafer maps that are similar to the wafer map comprising the generated random spatial pattern prior to applying the K-means type clustering.

9. A method according to claim 8, wherein comparing the wafer maps with the wafer map comprising a generated random spatial pattern comprises using a chi-square test wherein a p-value of the chi-square test is user-selectable.

10. An article of manufacture comprising a storage medium having instructions stored thereon that, if executed, result in:
applying K-means type clustering to wafer maps comprising one or more spatial patterns to group one or more clusters comprising wafer maps having similar spatial patterns;
producing a dendrogram using a clustering process to display the one or more clusters; and
filtering out wafer maps based on factory tool and run date by applying a process based on an Apriori algorithm; and
ranking the wafer maps that are not filtered out based on factory tool and run date by an ascending pareto-bound distance.

11. An article of manufacture according to claim 10, wherein filtering out wafer maps based on factory tool and run date comprises using conditional support wherein nodes of the process based on the Apriori algorithm comprise pairs of factory tool and run date wherein the run date is nested within the factory tool, and wherein ranking the wafer maps by the ascending pareto-bound distance is calculated on a conditional support-confidence plane.

12. An article of manufacture according to claim 11, wherein the instructions, if executed, further result in:
assigning a binary value to one or more die locations of the wafer maps to indicate whether the die location is above or below a threshold value;
filtering out wafer maps comprising spatial pattern densities that are above or below user-selectable values; and
smoothing the wafer maps using kernel-based smoothing prior to applying the K-means type clustering to the wafer maps.

13. An article of manufacture according to claim 11, wherein the instructions, if executed, further result in:
initializing a number of cluster seeds for the K-means type clustering prior to applying the K-means type clustering to the wafer maps wherein the number of cluster seeds is proportional to a number of wafer maps in a data set and wherein the cluster seeds are initialized to maximize a value of sum total distance between cluster seeds; and
filtering out clusters that contain less than a user-specified minimum of wafer maps prior to producing the dendrogram.

14. An article of manufacture according to claim 11, wherein the instructions, if executed, further result in:
refining the one or more clusters by comparing the wafer maps of the one or more clusters with a signature spatial pattern to remove wafer maps that are not similar to the signature spatial pattern;
assigning a binary value to one or more lots to indicate whether the one or more lots comprise a wafer map from a user-determined cluster.

15. An article of manufacture according to claim 11, wherein spatial pattern templates are not required prior to applying the K-means type clustering to the wafer maps.

16. An article of manufacture according to claim 11, wherein producing the dendrogram comprises using agglomerative clustering to allow a user to visually select final cluster assignment of the wafer maps.

17. An article of manufacture according to claim 11, wherein the instructions, if executed, further result in:
comparing the wafer maps with a wafer map comprising a generated random spatial pattern to filter out wafer maps that are similar to the wafer map comprising the generated random spatial pattern prior to applying the K-means type clustering.

18. An article of manufacture according to claim 17, wherein comparing the wafer maps with the wafer map comprising a generated random spatial pattern comprises using a chi-square test wherein a p-value of the chi-square test is user-selectable.

* * * * *